US008481995B2

(12) United States Patent  
Yamaga

(10) Patent No.: US 8,481,995 B2
(45) Date of Patent: Jul. 9, 2013

(54) IMAGE DISPLAY PANEL AND IMAGE DISPLAY APPARATUS HAVING ONE ADHESIVE FORMED AROUND ANOTHER ADHESIVE OF PREDETERMINED VOLUME RESISTANCE

(75) Inventor: Takumi Yamaga, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 584 days.

(21) Appl. No.: 12/751,293

(22) Filed: Mar. 31, 2010

(65) Prior Publication Data

US 2010/0276676 A1   Nov. 4, 2010

(30) Foreign Application Priority Data

May 1, 2009   (JP) .................................. 2009-112007
Feb. 23, 2010   (JP) .................................. 2010-037642

(51) Int. Cl.
*H01L 29/08*   (2006.01)
*H01L 23/52*   (2006.01)
*H01L 51/40*   (2006.01)

(52) U.S. Cl.
USPC ................................ 257/40; 257/211; 438/99

(58) Field of Classification Search
USPC ............................................. 257/40; 438/99
See application file for complete search history.

(56) References Cited

U.S. PATENT DOCUMENTS

| | | | |
|---|---|---|---|
| 7,166,689 B2 | 1/2007 | Sagisaka et al. | |
| 7,550,554 B2 | 6/2009 | Sagisaka et al. | |
| 2005/0181533 A1* | 8/2005 | Kawase et al. | 438/82 |
| 2006/0249817 A1* | 11/2006 | Kawase et al. | 257/622 |
| 2007/0048637 A1 | 3/2007 | Okada et al. | |
| 2007/0054212 A1 | 3/2007 | Akiyama et al. | |
| 2007/0148813 A1* | 6/2007 | Masuda | 438/99 |
| 2007/0221958 A1* | 9/2007 | Aoki | 257/211 |
| 2008/0012012 A1* | 1/2008 | Hara | 257/40 |
| 2008/0029766 A1 | 2/2008 | Onodera et al. | |
| 2008/0048181 A1* | 2/2008 | Tanaka et al. | 257/40 |
| 2009/0014715 A1 | 1/2009 | Yamaga et al. | |
| 2009/0014716 A1 | 1/2009 | Yamaga et al. | |
| 2009/0050879 A1 | 2/2009 | Yamaga et al. | |
| 2009/0095958 A1 | 4/2009 | Inoue et al. | |
| 2009/0189148 A1 | 7/2009 | Araumi et al. | |
| 2009/0206329 A1 | 8/2009 | Yamaga et al. | |
| 2009/0272966 A1 | 11/2009 | Yamaga et al. | |
| 2009/0321727 A1 | 12/2009 | Yutani et al. | |

FOREIGN PATENT DOCUMENTS

| | | | |
|---|---|---|---|
| JP | 2006060079 | * | 3/2006 |
| JP | 2006-156985 | | 6/2006 |
| JP | 2006-344952 | | 12/2006 |
| JP | 2009-48010 | | 3/2009 |

* cited by examiner

*Primary Examiner* — Ha Tran T Nguyen
*Assistant Examiner* — Dzung Tran
(74) *Attorney, Agent, or Firm* — Cooper & Dunham LLP

(57) ABSTRACT

An image display panel includes a gate electrode; a gate insulating film over the gate electrode; a source electrode, a drain electrode, and a first adhesive on the gate insulating film; an organic semiconductor layer on the source and drain electrodes including a space; an interlayer insulating film covering the gate insulating film, source electrode, organic semiconductor layer, and part of the drain electrode; a conductive layer on the interlayer insulating film; a second adhesive formed over the interlayer insulating film and conductive layer; an image display medium on the second adhesive; an inorganic film on the image display medium and first adhesive; and a second substrate on the inorganic film, where the first adhesive is arranged outside the second adhesive between the display medium and the conductive layer, and forms bonding between the inorganic film and the gate insulating film having a hydrophilic treatment formed on the first substrate.

13 Claims, 11 Drawing Sheets

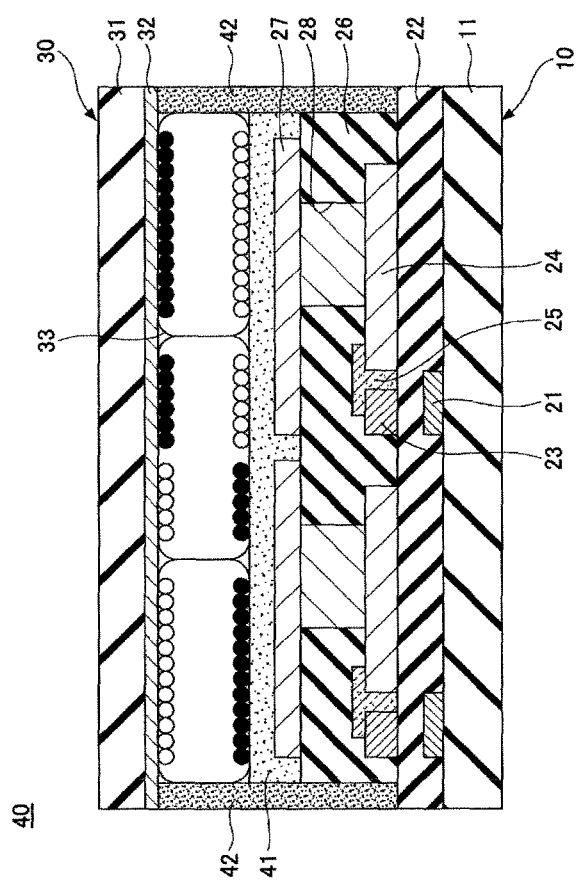

FIG.9

|  | 5 μm | 10 μm | 20 μm |
|---|---|---|---|
| COMPARATIVE EXAMPLE 1 | SHORT CIRCUIT OCCURRED AFTER 105 HOURS | SHORT CIRCUIT OCCURRED AFTER 195 HOURS | SHORT CIRCUIT OCCURRED AFTER 450 HOURS |
| EXAMPLE 1 | NO SHORT CIRCUIT OCCURRED AFTER 1000 HOURS | NO SHORT CIRCUIT OCCURRED AFTER 1000 HOURS | NO SHORT CIRCUIT OCCURRED AFTER 1000 HOURS |
| EXAMPLE 2 | SHORT CIRCUIT OCCURRED AFTER 835 HOURS | NO SHORT CIRCUIT OCCURRED AFTER 1000 HOURS | NO SHORT CIRCUIT OCCURRED AFTER 1000 HOURS |
| EXAMPLE 3 | NO SHORT CIRCUIT OCCURRED AFTER 1000 HOURS | NO SHORT CIRCUIT OCCURRED AFTER 1000 HOURS | NO SHORT CIRCUIT OCCURRED AFTER 1000 HOURS |

FIG.10

| | | ON-CURRENT (A) | ON-CURRENT DEGRADATION (%) | THRESHOLD VOLTAGE (V) | THRESHOLD VOLTAGE SHIFT (V) |
|---|---|---|---|---|---|
| COMPARATIVE EXAMPLE 2 | PRE-TEST | 1.2E-08 | | 7.9 | |
| | POST-TEST (AFTER 100 HOURS) | 1.1E-09 | 90.8 | 2.7 | 5.2 |
| EXAMPLE 4 | PRE-TEST | 1.1E-08 | | 4.1 | |
| | POST-TEST (AFTER 100 HOURS) | 7.8E-09 | 29.1 | 2.0 | 2.1 |

IMAGE DISPLAY PANEL AND IMAGE DISPLAY APPARATUS HAVING ONE ADHESIVE FORMED AROUND ANOTHER ADHESIVE OF PREDETERMINED VOLUME RESISTANCE

BACKGROUND OF THE INVENTION

1. Field of the Invention

The invention generally relates to an image display panel having a transistor array, and an image display apparatus having such an image display panel.

2. Description of the Related Art

Recently, extensive studies have been made on an organic thin film transistor made of an organic semiconductor material, and an organic thin film transistor array having such integrated organic thin film transistors arranged in a matrix. Advantages of the organic thin film transistor and the organic thin film transistor array typically include that they can be made of various materials, fabrication methods and fabrication shapes are highly flexible, they are be easily increased in the size of surface areas, can be made with a simple layer configuration so as to make fabrication processes simple, and can be fabricated using an inexpensive fabrication apparatus. The image display panel having flexibility and the image display apparatus having such an image display panel can be implemented by combining an organic thin film transistor array formed on a film substrate and an image display medium.

In the fabrication of the organic thin film transistor arrays, thin films and circuits can be easily formed by printing, spin coating, and dipping methods. The organic thin film transistor arrays made with these methods can be cheaper than the related art thin film transistors made of a Si semiconductor material. In particular, with an ink-jet printing method, since an ink-jet head is capable of discharging ink droplets directly to plot patterns on a substrate, material usability can be significantly improved. Thus, patterning the inorganic semiconductor layers or electrode materials by ink-jet printing is capable of simplifying the fabrication process, improving the yield rate, and lowering the fabrication cost.

However, at present, there is less reliability in forming wiring patterns in the fabrication of the organic thin film transistor arrays by the ink-jet printing method. Electrochemical migration is a phenomenon where metal is deposited in the form of dendrites between electrodes as a result of voltage being applied between the electrodes under a high-humidity environment. A typical material for forming wiring patterns by ink-jet printing may be nano-metal ink that is made of nano-size metal fine particles dispersed in a solution. The nano-metal ink is mainly formed of inexpensive Ag materials having high conductivity. However, since Ag materials are susceptible to ionmigration (i.e., electrochemical migration; hereinafter also simply called "migration"), it may be necessary to have technology for preventing ionmigration (herein after called "migration preventing technology") when Ag materials are used in the fabrication of the organic thin film transistor arrays.

As an example of such migration preventing technology, Japanese Patent Application Publication No. 2006-344992 discloses a known technology to prevent moisture intrusion in which an inorganic barrier layer is formed for excluding moisture in the fabrication of the organic thin film transistor arrays. In addition, as another technology that does not rely on the technology to prevent moisture intrusion, a technology is known in which metallic materials such as alloy having excellent electrochemical migration resistance are used in the fabrication of the organic thin film transistor arrays.

Furthermore, it is generally known that organic semiconductor materials utilized for organic thin film transistors are susceptible to electric property degradation with aging when allowed to stand in the air. The electric property degradation with age results from structural changes in the organic semiconductor materials due to oxidization and deterioration with oxygen and moisture in the air. Similar to the above migration preventing technology, Japanese Patent Application Publication No. 2006-156985 discloses a technology in which the electric property degradation in organic semiconductors with aging is also prevented by forming inorganic or organic barrier layers to protect the organic semiconductors in the fabrication of the organic thin film transistor arrays.

However, the application of the above technologies, in which moisture is excluded by forming the barrier layers or metallic materials having excellent electrochemical migration resistance, to the fabrication of the organic thin film transistor arrays results in increasing fabrication cost of the image display panel and the image display apparatus.

SUMMARY OF THE INVENTION

Accordingly, it is a general object of at least one embodiments of the present invention to provide an image display panel having an organic semiconductor layer and an image display apparatus having the image display panel capable of improving migration resistance and suppressing deterioration of the organic semiconductor layer without increasing the fabrication cost.

According to one aspect of the present invention, there is provided an image display panel that includes a gate electrode formed on a first substrate; a gate insulating film formed over the gate electrode; a source electrode, a drain electrode, and a first adhesive formed at intervals on the gate insulating film; an organic semiconductor layer formed in regions on the source electrode and the drain electrode including a space formed therebetween; an interlayer insulating film formed to cover the gate insulating film, the source electrode, the organic semiconductor layer, and part of the drain electrode; a conductive layer formed on the interlayer insulating film so as to be connected to the drain electrode via a through hole; a second adhesive formed over the interlayer insulating film and the conductive layer; an image display medium formed on the second adhesive; an inorganic film formed on the image display medium and the first adhesive formed on the gate insulating film; and a second substrate placed on the inorganic film. In the image display panel, the first adhesive is arranged outside the second adhesive placed between the image display medium and the conductive layer, and the first adhesive forms bonding between the inorganic film on which the second substrate is placed and the gate insulating film having a hydrophilic treatment formed on the first substrate.

According to another aspect of the present invention, there is provided an image display panel that includes a gate electrode formed on a first substrate; a gate insulating film formed over the gate electrode; a source electrode and a drain electrode formed at intervals on the gate insulating film; an organic semiconductor layer formed in regions on the source electrode and the drain electrode including a space formed therebetween; an interlayer insulating film formed to cover the gate insulating film, the source electrode, the organic semiconductor layer, and part of the drain electrode; a conductive layer and a first adhesive formed on the interlayer insulating film, such that the conductive layer is connected to the drain electrode via a through hole; a second adhesive formed over the interlayer insulating film and the conductive layer; an image display medium formed on the second adhesive; an inorganic film formed on the image display medium and the first adhesive; and a second substrate placed on the inorganic film. In the image display panel, the first adhesive is arranged outside the second adhesive placed between the image display medium and the conductive layer, and the first adhesive forms bonding between the inorganic film on which the second substrate is placed and the interlayer insulating film having a hydrophilic treatment.

According to another aspect of the present invention, there is provided an image display panel that includes a first inorganic film formed over a first substrate; a gate electrode and a first adhesive formed on the first inorganic film formed over the first substrate; a gate insulating film formed over the gate electrode; a source electrode and a drain electrode formed at intervals on the gate insulating film; an organic semiconductor layer formed in regions on the source electrode and the drain electrode including a space formed therebetween; an interlayer insulating film formed to cover the gate insulating film, the source electrode, the organic semiconductor layer, and part of the drain electrode; a conductive layer formed on the interlayer insulating film so as to be connected to the drain electrode via a through hole; a second adhesive formed over the interlayer insulating film and the conductive layer; an image display medium formed on the second adhesive; a second inorganic film formed on the image display medium and the first adhesive formed on the first inorganic film on the first substrate; and a second substrate placed on the second inorganic film formed on the image display medium. In the image display panel, the first adhesive is arranged outside the second adhesive placed between the image display medium and the conductive layer, and the first adhesive forms bonding between and the first inorganic film formed on the first substrate and the second inorganic film on which the second substrate is placed.

According to another aspect of the present invention, there is provided an image forming apparatus that includes one of the above image display panels, a display unit, a control unit, and an operations unit.

Other objects and further features of the present invention will be apparent from the following detailed description when read in conjunction with the accompanying drawings.

BRIEF DESCRIPTION OF THE DRAWINGS

FIG. 5 is a view illustrating an example of an electrophoretic image display panel according to the embodiment of the invention;

FIG. 9 is a table illustrating first results of Comparative Example and Examples;

FIG. 10 is a table illustrating second results of Comparative Example and Examples.

DESCRIPTION OF THE PREFERRED EMBODIMENTS

In the following, embodiments for carrying out the present invention will be described by referring to the accompanying drawings.

Figure 1:
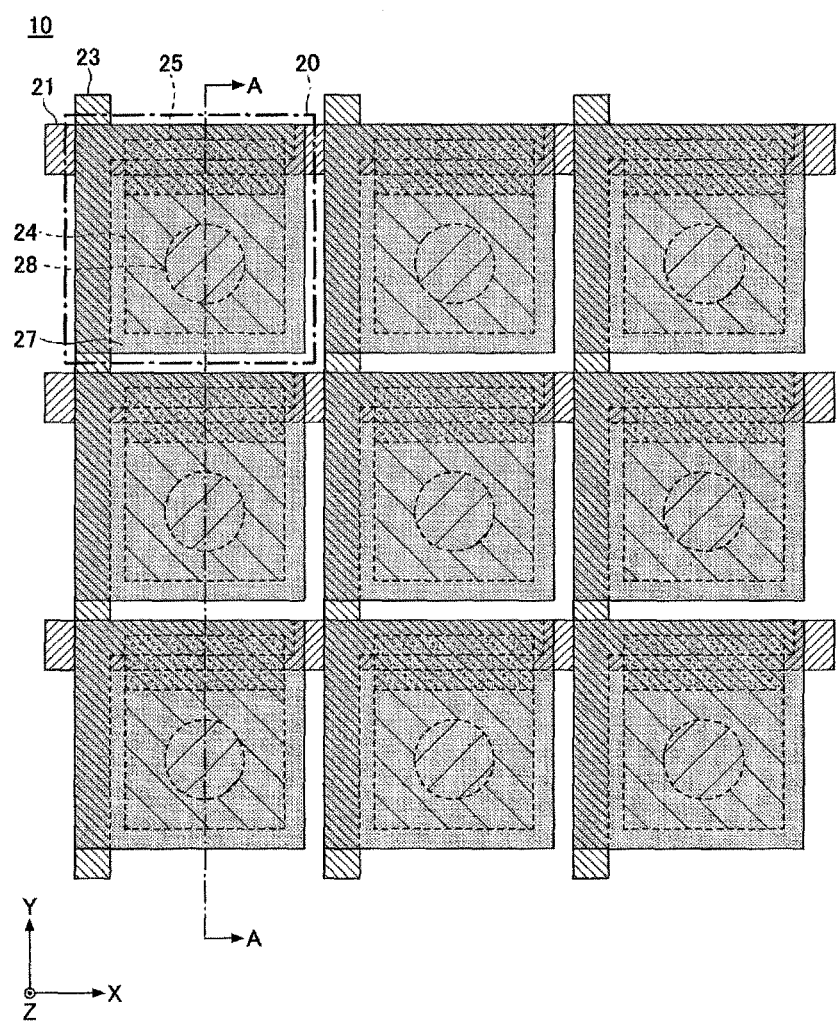
FIG. 1 is a plan view illustrating an organic transistor array according to an embodiment of the invention.
Figure 2:
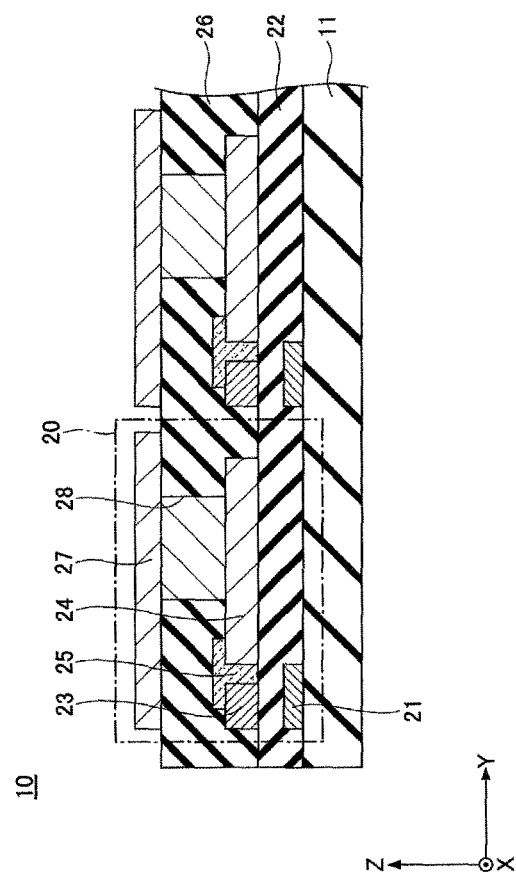
FIG. 2 is a cross-sectional view of the organic transistor array taken along a line A-A of FIG. 1.

First, an organic transistor array 10 according to an embodiment of the invention is described with reference to FIGS. 1 and 2. FIG. 1 is a plan view illustrating the organic transistor array 10 according to the embodiment of the invention. FIG. 2 is a cross-sectional view of the organic transistor array 10 taken along a line A-A of FIG. 1. Note that gate insulating films and interlayer insulating films illustrated in FIG. 1 are omitted in FIG. 2. In addition, same hatchings provided with components of FIG. 1 are also provided with corresponding components in cross section of FIG. 2 to clarify a correspondent relationship of the components between FIGS. 1 and 2.

Referring to FIGS. 1 and 2, an organic transistor array 10 includes scan lines and signal lines provided in a matrix on a substrate 11, and organic transistors 20 provided in respective pixel regions formed by intersections of the scan lines with the signal lines.

The organic transistors 20 include a gate electrode 21, a gate insulating film 22, a source electrode 23, a drain electrode 24, an organic semiconductor layer 25, an interlayer insulating film 26, and a conductive layer 27. The scan lines are integrally connected to the gate electrodes 21 of the organic transistors 20 arranged in X-axis directions. The signal lines are integrally connected to the source electrodes 23 of the organic transistors 20 arranged in Y-axis directions.

In each organic transistor 20, the gate electrode 21 is formed so as to be connected to the scan line formed on the substrate 11. The gate insulating film 22 is formed so as to cover the scan line and the gate electrode 21 formed on the substrate 11. The source electrode 23 is formed so as to be connected to the signal line formed on the gate insulating film 22. The drain electrode 24 is formed in a predetermined region above the gate electrode 21. That is, the drain electrode 24 faces the source electrode 23 with a channel region sandwiched between the drain electrode 24 and the source electrode 23.

The source electrode 23 and the drain electrode 24 are formed so as to have a predetermined distance of a channel length from each other. A region corresponding to the predetermined distance of the channel length (hereinafter called a "channel region") between the source electrode 23 and the drain electrode 24 is located above the gate electrode 21. The organic semiconductor layer 25 is formed in the channel region on the gate insulating film 22. The interlayer insulating film 26 is formed so as to cover the organic semiconductor layer 25. The conductive layer 27 is formed over the interlayer insulating film 26. The conductive layer 27 is connected with the drain electrode 24 via a through hole 28 formed in the interlayer insulating film 26.

Note that the scan lines and the gate electrodes 21, and the signal lines and the source electrodes 24 may be formed by typical photolithography; however, they may alternatively be formed by print processes such as screen printing, ink-jet printing, flexography, gravure printing, and offset lithography. Among these, ink-jet printing is particularly preferable in view of patterning accuracy, an increase in size of the surface areas, low cost, and reduction in the number of processes. Further, patterning accuracy may be significantly improved by ink-jet printing; that is, an insulating material the surface energy of which is changed by irradiating a surface of the insulating material with ultraviolet rays is used for the insulation film and the like, and ink-jet printing is applied on a high-energy surface area obtained after the irradiation with the UV rays. As ink for ink-jet printing, metallic ink formed of metallic particles dispersed in a solution is preferably used. Examples of the metallic particle include Au, Ag, Cu, Pt, Pd, Ni, Ir, Rh, Co, Fe, Mn, Cr, Zn, Mo, W, Ru, In, and Sn, and two or more types of these metallic particles may be used in combination. Among these, Au, Ag, Cu, and Ni are particularly preferable in view of electric resistance, thermal conductivity, and corrosion resistance.

However, in use of the above mentioned metallic particles, it is desirable to prepare some technologies for preventing electrochemical migration. In particular, electrochemical migration is likely to occur when Ag or Cu is used as metallic particles. A technology for preventing electrochemical migration will be described later.

The metallic ink used for printing is obtained by uniformly dispersing metallic particles having an average particle size of about several to tens of nanometers in a solvent. The metallic particles can be easily sintered by heat treatment. This results from the fact that the metallic particles have a characteristic in which the smaller the particle size is, the higher is the obtained activation of atoms of the surface.

conductive polymers. Examples of the conductive polymers include polythiophene, polyaniline, polypyrrole, polyparaphenylene, and polyacetylene. Alternatively, the above polymers may be doped to be used as the conducting polymers. Among these, polystyrenesulfonate doped PEDOT (PEDOT-PSS), a complex of polyethylenedioxythiophene (PEDOT) and poly(styrene sulfonate) (PSS) is particularly preferable in view of electric conducitivity, stability, and heat resistance. The conductive polymer electrical properties can be adjusted by changing the polymerization level and the structure thereof. Moreover, since the conductive polymer does not require sintering, the electrode may be formed at low temperature.

The organic semiconductor layer 25 is preferably formed by print processes such as screen printing, ink-jet printing, flexography, gravure printing, and offset lithography; and among these, the ink-jet printing is particularly preferable in view of patterning accuracy, low cost, and material solubility. It is preferable that the organic semiconductor layer 25 contain an organic semiconductor material soluble in the organic solvent. If the organic semiconductor layer 25 contains the organic semiconductor material soluble in the organic solvent, the organic semiconductor layer 25 may be formed with the organic semiconductor ink obtained by dissolving the organic semiconductor material in the organic solvent. Examples of the organic semiconductor material include, but not limited to, polymer materials, oligomer materials, and low-molecular materials. Among these, the polymer material having a triarylamine skeleton is preferable, and the compound shown by the following formula 1 is particularly preferable. The preferable polymer material having the triarylamine skeleton shown in the following formula 1 is a nonorientation polymer material that exhibits extremely low variability in its properties regardless of film forming methods or film forming shapes.

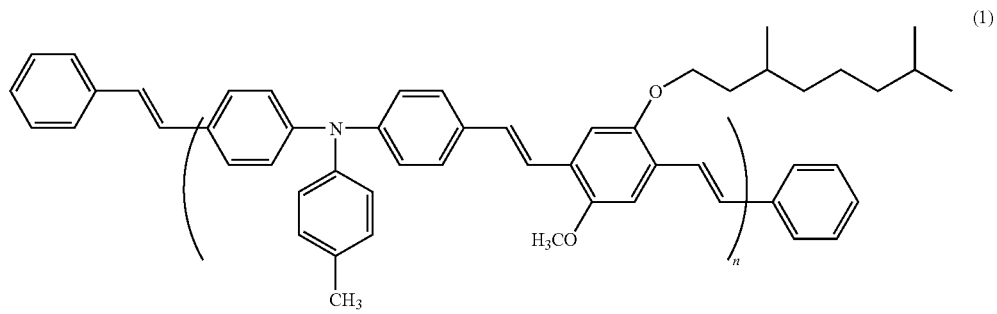

(1)

Accordingly, since the metallic ink is applied by inkjet printing and the obtained product is then sintered, the electrodes can be directly printed or patterned on the substrate. In this process, it is preferable that the metallic ink have the surface tension of approximately 30 mN/m. Further, the metallic ink may preferably have the viscosity of 2 to 13 mPa-sec, and more preferably have the viscosity of 7 to 10 mPa-sec. If the metallic ink has inappropriate surface tension or viscosity, the metallic ink may have a difficulty in being discharged from the inkjet head. Moreover, the metallic ink may not form round droplets, or have longer ligaments. Further, it is preferable that the metallic ink have dryness to a certain extend to which the metallic particles are not solidified when the discharged solvent volatilizes.

The scan lines, the gate electrodes 21, the signal lines, the source electrodes 23, and the drain electrodes 24 may include The interlayer insulating film 26 is preferably formed by print processes such as screen printing, ink-jet printing, flexography, gravure printing, and offset lithography; and among these, the ink-jet printing is particularly preferable. Forming the interlayer insulating film 26 by ink-jet printing may increase the throughput, reduce the number of processes, and reduce the cost compared to that of forming by photolithography. It is preferable that the interlayer insulating film 26 contain binding resin and particles. Examples of the biding resin include polyvinylalcohol resins, polyvinyl acetal resins, acrylic-based resins, ethylcellulose resins, polyethylene, polystyrene, and polyamide; and two or more types of these resins may be used in combination.

Any particles including organic and inorganic particles may be used insofar as the particles retain their particle shapes and properties in the interlayer insulating film 26; however, the inorganic particle are preferable because they are easy to control and can be dispersed in the solvent. Examples of the organic particles include, but are not limited to, carbon black, azo-based pigments, phthalocyanine-based pigments, and perylene-based pigments; and two or more types of these pigments may be used in combination. Examples of the inorganic particles include, but not limited to, metallic oxides such as silica, alumina, titanium oxide, zinc oxide, and barium titanate; metallic hydroxides; a metal complex; and two or more types of these particles used in combination. Among these, silica, alumina, and zinc oxide are particularly preferable because they have low elative dielectric constants.

These particles may be porous particles having mesopores or macropores, an example of which includes mesoporous silica. Note that the interlayer insulating film 26 may be obtained by mixing the binding resin and particles with the solvent, and by optionally adding an insulating paste obtained by mixing dispersant, plasticizer, viscosity modifier, and the like. The mixing ratio of the binding resin and particles may be appropriately adjusted to create the paste having optimal physical properties for forming patterns. However, it is preferable that the amount of the binding resin to be mixed be greater than that of the particles to obtain the flexibility of the interlayer insulating film 26.

In general, transistor properties of the organic thin film transistor may be degraded with time due to the organic semiconductor material of the organic thin film transistor absorbing light. It is preferable that the interlayer insulating film 26 be capable of cutting off light that the organic semiconductor layer 25 would otherwise absorb. Accordingly, it is preferable that the interlayer insulating film 26 contain a light absorbable material or a light reflective material.

Materials for the interlayer insulating film 26 capable of cutting off light that the organic semiconductor layer 25 absorbs are not particularly specified insofar as the interlayer insulating film 26 retains insulating properties, and may include color pigments such as metallic oxides, metallic hydroxides, metallic complex, carbon black, azo-based pigments, phthalocyanine-based pigments, and perylene-based pigments, and dye such as aniline black and indigo. Two or more of these materials may be used in combination. Materials for the interlayer insulating film 26 capable of reflecting light that the organic semiconductor layer 25 absorbs are not particularly specified insofar as the interlayer insulating film 26 retains insulating properties, and may include white pigments such as zinc oxide and titanium oxide. Two or more of these materials may be used in combination.

Next, the electrophoretic image display medium is described. The electrophoretic image display medium includes two planer electrodes, and cells encapsulating fluid dispersion having dispersed electrophoretic particles between the two planer electrodes. The electrophoretic particles are charged in advance. When the voltage is applied between the two electrodes, the charged electrophoretic particles are moved in one of upper and lower directions due to the influence of electric field generated between the electrodes. Display color may be changed by inverting the voltage applied between the electrodes. That is, the display color can be changed as a result of inverted moving directions of the electrophoretic particles by inverting the electric field acting on the electrophoretic particles. Note that when the voltage application to the electrodes is deactivated, the electrophoretic particles stop moving and remain in either one of the directions. The display color of the electrophoretic image display medium can be retained in the above fashion even if the voltage application to the electrodes is deactivated.

Figure 3:
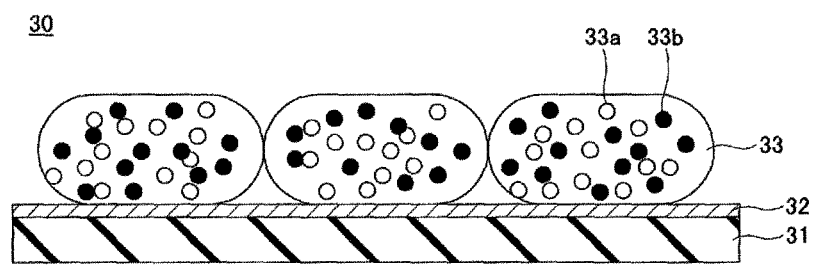
FIG. 3 is a cross-sectional diagram illustrating an example of an electrophoretic image display medium according to the embodiment of the invention.

FIG. 3 is a cross-sectional diagram illustrating an example of the electrophoretic image display medium 30 according to the embodiment of the invention. Referring to FIG. 3, the electrophoretic image display medium 30 includes a substrate 31, a transparent conductive film 32, and microcapsules 33. In the electrophoretic image display medium 30, the transparent conductive film 32 is formed on the substrate 31, and the microcapsules 33 containing a mixture of white particles 33a and black particles 33b are uniformly placed over the transparent conductive film 32. The transparent conductive film 32 may be made of Indium Tin Oxide (ITO).

The electrophoretic image display medium 30 may be formed by the following method. Titanium oxide, a silicone macromer/methacrylic acid copolymer, silicone polymer graft carbon black and silicone oil are initially mixed, and the black and white particles contained in the fluid dispersion are then dispersed by the ultrasonic waves, to thereby prepare a black-and-white particle containing fluid dispersion. Subsequently, the prepared black and white particle containing fluid dispersion is encapsulated by gelatin-gum arabic complex coacervation method to form the microcapsules 33. Then, using a wire blade method, a fluid dispersion having the microcapsules 33 dispersed in a urethane resin solution is expanded over the transparent electrode film-attached substrate, thereby forming the electrophoretic image display medium 30.

Figure 4A:
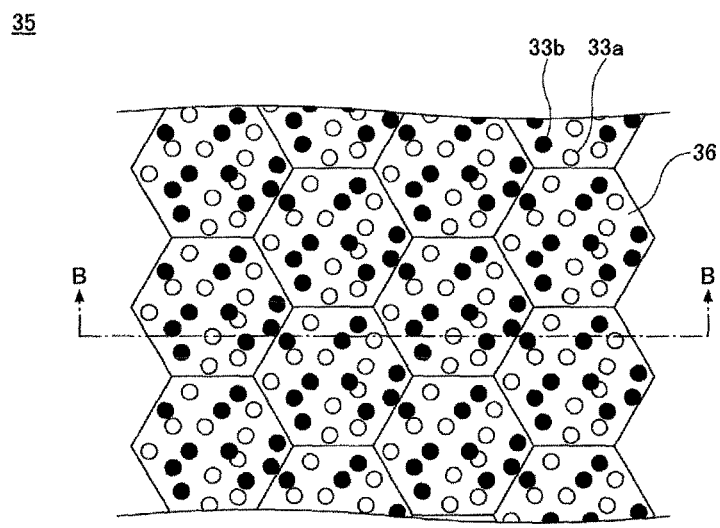
FIG. 4A is a plan view illustrating an example of another electrophoretic image display medium according to the embodiment of the invention.
Figure 4B:
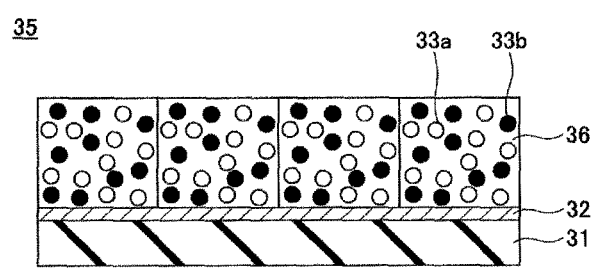
FIG. 4B is a cross-sectional view of the electrophoretic image display medium taken along a line B-B of FIG. 4.

FIG. 4A is a plan view illustrating an example of another electrophoretic image display medium 35 according to the embodiment of the invention. FIG. 4B is a cross-sectional view of the electrophoretic image display medium 35 taken along a line B-B of FIG. 4. Referring to FIGS. 4A and 4B, the electrophoretic image display medium 35 includes a substrate 31, a transparent conductive film 32, and honeycomb cells 36. In the electrophoretic image display medium 35, the transparent conductive film 32 is formed on the substrate 31, and the honeycomb cells 36 containing a mixture of white particles 33a and black particles 33b are uniformly placed over the transparent conductive film 32. The transparent conductive film 32 may be made of Indium Tin Oxide (ITO).

The electrophoretic image display medium 35 may be formed by the following method. The honeycomb cells 36 made of resin are formed by photolithography over the transparent conductive film 32 formed on the substrate 31. The honeycomb cells 36 are filled with the black and white particle containing fluid dispersion adjusted by the above method, and surfaces of the honeycomb cells 36 are then sealed with a material such as resin, thereby forming the electrophoretic image display medium 35 illustrated in FIGS. 4A and 4B.

Next, an electrophoretic image display panel 40 according to the embodiment is described. Note that the following descriptions are given with examples of the electrophoretic image display panels 40, 50, 60, and 70 each including the electrophoretic image display medium 30; however, the electrophoretic image display panels 40, 50, 60, and 70 may include the electrophoretic image display medium 35 in place of the electrophoretic image display medium 30 to exhibit the same effect.

FIG. 5 is a view illustrating an example of the electrophoretic image display panel 40 according to the embodiment of the invention. In FIG. 5, the same reference numerals are assigned to components identical to those of FIGS. 1 through 4, and the descriptions thereof may be omitted. Referring to FIG. 5, the electrophoretic image display panel 40 includes the organic transistor array 10, the electrophoretic image display medium 30, a first adhesive layer 41, and a second adhesive layer 42. In the electrophoretic image display panel 40, the organic transistor array 10 and the electrophoretic image display medium 30 are arranged such that the conductive layer 27 faces the microcapsules 33, and then fixed by the first and second adhesive layers 41 and 42.

The first adhesive layer 41 is formed in an electrophoretic image display medium region. The second adhesive layer 42 is formed around the first adhesive layer 41. The microcapsules 33, the conductive layer 27, and the interlayer insulating film 26 are fixed by the first adhesive layer 41 whereas the transparent conductive film 32 and an outer region of organic transistor array 10 such as the gate insulating film 22 are fixed by the second adhesive layer 42.

The volume resistance value is important for the first adhesive layer 41 fixing the microcapsules 33, the conductive layer 27, and the interlayer insulating film 26. The volume resistance value of the first adhesive layer 41 affects the contrast, resolution and responsiveness of a screen displayed on an image display panel. If the first adhesive layer 41 has a low volume resistance value, partial pressure of the electrophoretic image display medium 30 gets high when the voltage is applied to the conductive layer 27 of the pixel electrode, thereby increasing the responsiveness of the display screen. However, leakage current may be easily generated between the adjacent conductive layers 27. In particular, the leakage current is easily generated between the adjacent conductive layers 27 if there are potential differences between the adjacent conductive layers 27. Due to the leakage current, the conductive layers 27 may not retain a desired potential, thereby degrading the contrast of the display screen. Note that if distances between the adjacent conductive layers are increased for preventing the leakage current, the resolution and contrast of the display screen are degraded.

If the first adhesive layer 41 has a high volume resistance value, the distances between the adjacent conductive layers 27 are decreased to the extent in which the leakage current generated between the adjacent conductive layers 27 can be reduced or prevented, thereby improving the resolution and contrast of the display screen. However, the partial pressure of the electrophoretic image display medium 30 is lowered, resulting in degradation of the responsiveness in the display screen. Therefore, the first adhesive layer 41 is desired to have a volume resistance value suitable for image display on the screen. The volume resistance value of the first adhesive layer 41 can be optionally set; however, the preferable resistance value of the first adhesive layer 41 may be in a range of 109 to 1011 Ω-cm.

Materials for the first adhesive layer 41 include EVA-based (Ethylene-vinyl acetate) adhesives, elastomer-based adhesives, polyamide-based adhesives, polyester-based adhesives, polyolefin-based adhesives, and polyurethane-based adhesives. If the above adhesives have high volume resistance values, conductive filler may be added to the adhesives to obtain respective desired volume resistance values. Materials for the conductive filler include carbon-based particles such as carbon black, carbon nanotube, fullerene, and graphite; metallic particles such as copper, silver, gold, aluminum, nickel, and platinum; metallic oxides such as metallic flakes, metallic fiber, zinc oxide, and indium oxide; and conductive titanium oxide, metal-fiber resin, metal-coated fibers, and metal-coated particles.

The second adhesive layer 42 is desired to have functions to block moisture and oxygen intrusion from outside in order to suppress electrochemical migration caused by the gate electrodes 21 containing metallic particles such as Ag, the source electrodes 23, and the drain electrodes 24, and degradation of the organic semiconductor layers 25. When the electrochemical migration is caused by the gate electrodes 21 containing metallic particles such as Ag, the source electrodes 23, and the drain electrodes 24, the Ag and the like accumulated at an anode side are ionized in water. By the application of voltage, the Ag ions and the like finally reach a cathode side, thereby precipitating Ag and the like while decomposing or generating oxides and hydroxides. The above process is repeated to develop short circuits between the source electrodes 23 and the drain electrodes 24, or the source electrodes 23 and the gate electrodes 21. The shorts in the organic semiconductor materials contained in the organic transistor were due to external air components, moisture, oxygen, and the like, which results in on-current degradation of the organic transistor 20 or causing a threshold voltage $V^{th}$ shift.

Accordingly, a preferable adhesive selected as the second adhesive layer 42 is desired to have properties to suppress the above deterioration. Materials for the second adhesive layer 42 include epoxy resin based adhesives, acrylic resin based adhesives, and allyl resin based adhesives that have high moisture-oxygen blocking capacities.

Specifically, bulk permeability may play an important role on the moisture-oxygen blocking capacities; however, permeability from an adhesive interface may play a more important role on the moisture-oxygen blocking capacities. Accordingly, it is preferable that the second adhesive layer 42 be applied to the adhesive interface for moisture-oxygen blocking. Adhesive interface properties may vary with the materials used for the second adhesive layer 42; however, the adhesives may frequently form a strong adhesive interface between inorganic films. Accordingly, it is preferable that the adhesive interface of the second adhesive layer 42 capable of blocking moisture or oxygen intrusion from outside be formed with a surface of the inorganic film. For example, as illustrated in the electrophoretic image display panel 40 of FIG. 5, it is preferable that an adhesive interface be formed between the inorganic transparent conductive film 32 and the second adhesive layer 42 at the substrate 31 side. For the second adhesive layer 42, it is desired to select a material having a strong surface adhesive interface at the substrate 11 side of the second adhesive layer 42. For example, as illustrated in the electrophoretic image display panel 40 of FIG. 5, it is preferable that an adhesive interface be formed between the gate insulating film 22 having a high energy region and the second adhesive layer 42 at the substrate 11.

In this case, as a material for the gate insulating film 22, an insulating material, the surface energy (critical surface tension) of which is changed by the application of UV rays, is prepared. The UV rays are then applied in advance to a region to form an adhesive interface between the gate insulating film 22 and the second adhesive layer 42 (hereinafter also called "adhesive interface forming region"), so that the adhesive interface forming region has high energy. Alternatively, heat, electron beams, or plasma may be applied to the adhesive interface forming region to have high energy in place of UV rays. Note the high energy region indicates a region having higher surface energy after application of UV rays or the like than before the application of UV rays. The high energy region, for example, includes surface energy of 40 mN/m or more.

Other Embodiments

Figure 6:
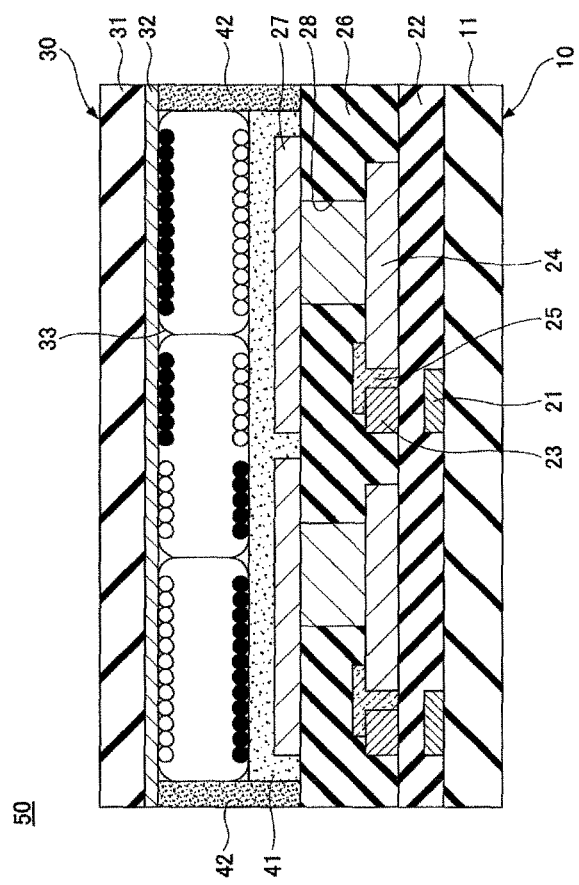
FIG. 6 is a view illustrating an example of an electrophoretic image display panel according to another embodiment of the invention.
Figure 7:
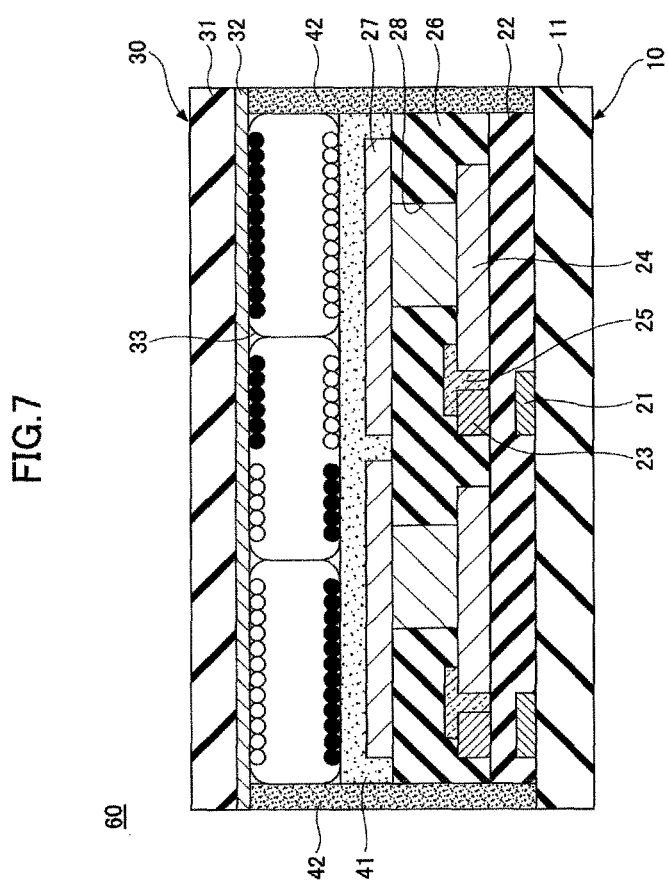
FIG. 7 is a view illustrating still another example of an electrophoretic image display panel according to still another embodiment of the invention.
Figure 8:
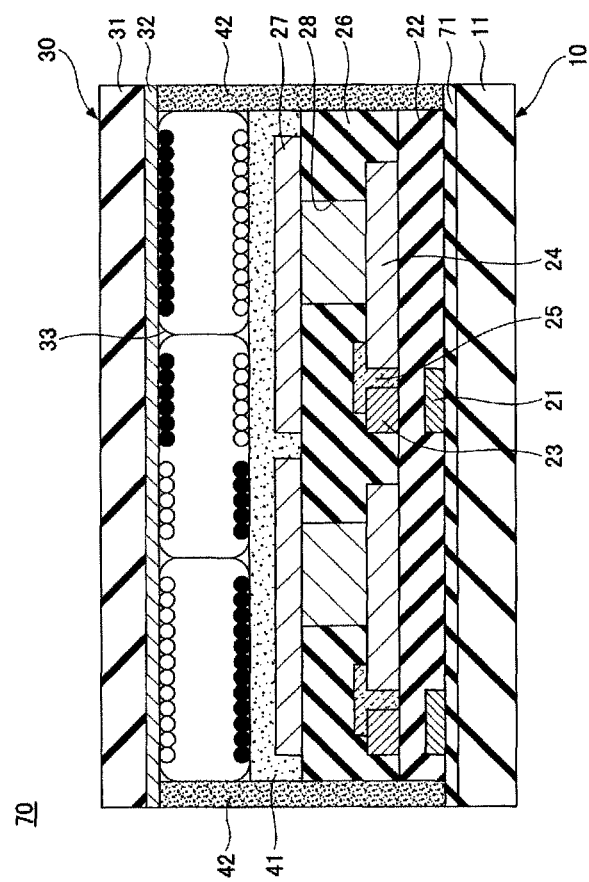
FIG. 8 is a view illustrating yet another example of an electrophoretic image display panel according to yet another embodiment of the invention.

FIGS. 6 through 8 are views illustrating examples of electrophoretic image display panels 50, 60, and 70 according to other embodiments of the invention. The adhesive interface of the second adhesive layer 42 at the substrate 11 side may be placed in one of the examples illustrated in FIGS. 6 through 8. Specifically, as illustrated in the electrophoretic image display panel 50 of FIG. 6, the adhesive interface may be formed between the interlayer insulating film 26 and the second adhesive layer 42 at the substrate 11 side. Further, as illustrated in the electrophoretic image display panel 60 of FIG. 7, the adhesive interface may be formed between the interlayer insulating film 11 itself and the second adhesive layer 42 at the substrate 11 side. Moreover, as illustrated in the electrophoretic image display panel 70 of FIG. 8, an inorganic film 71 is formed on the substrate 11 in advance, and the adhesive interface may be formed between the inorganic film 71 on the substrate 11 and the second adhesive layer 42 at the substrate 11 side. Materials for the inorganic film 71 include silicon dioxide, silicon nitride, and alumina.

As described above, it is preferable to form an adhesive interface between the organic film such as the transparent conductive film 32 and the second adhesive layer 42 at the substrate 31 side. Another adhesive interface may be formed between one of the gate insulating film 22, the interlayer insulating film 26, and the substrate 11 itself, and the second adhesive layer 42 at the substrate 11 side; however, the adhesive interface may be formed between the inorganic film such as the inorganic film 71 and the second adhesive layer 42 at the substrate 11 side.

In the electrophoretic image display panels 40, 50, 60, and 70 according to the embodiment of the invention illustrated in FIGS. 5 through 8, it is preferable that the surfaces corresponding to the adhesive interface be cleaned with oxygen plasma or UV ozone so that the electrophoretic image display panels 40, 50, 60, and 70 have more hydrophilic surfaces. This surface treatment is called a hydrophilic treatment.

According to the embodiments, the first adhesive layer having a predetermined volume resistance is formed in the electrophoretic image display medium region of the electrophoretic image display panel, and the second adhesive layer is formed around the first adhesive layer. With this configuration, the electrophoretic image display panel is capable of exhibiting excellent contrast, resolution, and responsiveness, having an improved migration resistance for Ag or the like, and suppressing the deterioration of the organic semiconductor.

Further, according to the embodiment, since neither barrier layer nor metallic material having the migration resistance is formed in the electrophoretic image display panel, the migration resistance for Ag or the like may be improved, and the deterioration of the organic semiconductor may be suppressed without raising the fabrication cost of the electrophoretic image display panel.

Note that since a film substrate utilized for an image display panel such as the electrophoretic image display panel generally has a low heat resistance, Ag having a relatively low sintering temperature is frequently used as the source electrodes. As a result, there is high probability of the occurrence of migration. However, with the configuration of the embodiment, the migration can be appropriately suppressed even if materials prone to migration generation other than Ag (e.g., Cu) are used as for the source electrodes. Therefore, the electrophoretic image display panel according to the embodiment can particularly exhibit an effect of suppressing the migration when there is a difficulty in selecting the metallic materials having migration resistance due to problems with sintering temperature, and resistance-process adaptabilities of the desired materials.

EXAMPLES

Subsequently, comparative examples and examples are described below.

Comparative Example 1

An $Al_2O_3$ film of 100 nm thickness was deposited on a first film substrate by sputtering. The $Al_2O_3$ film was coated with polyamide acid by spin coating, and the polyamide acid coated $Al_2O_3$ film was then heated at 180° C. to thereby obtain a first polyimide film having a film thickness of 500 nm.

Likewise, an $Al_2O_3$ film of 100 nm thickness was deposited on a second film substrate by sputtering. The $Al_2O_3$ film was coated with polyamide acid by spin coating, and the polyamide acid coated $Al_2O_3$ film was then heated at 180° C. to thereby obtain a second polyimide film having a film thickness of 500 nm. Further, upon irradiation with UV rays from a UV lamp (irradiance: 7 J/cm$^2$), a high energy pattern corresponding to a comb-like electrode structure was formed on the second polyimide film via a photo-mask pattern. Subsequently, Ag ink was applied on the high energy pattern by ink-jet printing, and then the Ag ink applied high energy pattern was sintered at 180° C. to thereby obtain a comb-like electrode having a film thickness of 100 nm. Note that the comb-like electrode is composed of a pair of electrodes facing each other each having a set of strip shaped electrodes extended from one end thereof, and the pair of electrodes is arranged such that the strip-shaped electrodes of one electrode are placed in gaps between the strip-shaped electrodes of the other. In Comparative Example 1, the width of the electrode was set as approximately 800 mm, and the respective gaps between the strip-shaped electrodes were set as approximately 5 μm, 10 μm, and 20 μm.

Next, an adhesive (HC-1920/Epoxy resin-based adhesive/ Mitsui Chemicals, Inc.) was applied by a dispenser to an outer periphery of the second film substrate, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the respective first and second polyimide films were thus formed.

Next, an ionmigration test was carried out on the obtained sample. Testing conditions were determined as follows; electric field applied was set as 20 V, and a testing environment was set as 85° C./85% RH. FIG. 9 is a table illustrating first results of Comparative Example and Examples. As illustrated in FIG. 9, short circuits due to ionmigration occurred after 450 hours in all the conditions where the respective gaps between the strip shaped electrodes were approximately 5 μm, 10 μm, and 20 μm.

Example 1

An $Al_2O_3$ film of 100 nm thickness was deposited on a first film substrate by sputtering. A first indium-tin-oxide (ITO) film of 100 nm was subsequently deposited on an outer periphery region of the first film substrate by sputtering.

Likewise, an $Al_2O_3$ film of 100 nm thickness was deposited on a second film substrate by sputtering. A second indium-tin-oxide (ITO) film of 100 nm was subsequently deposited on an outer periphery region of the second film substrate by sputtering. The $Al_2O_3$ film was coated with polyamide acid by spin coating, and the polyamide acid coated $Al_2O_3$ film was then heated at 180° C. to thereby obtain a polyimide film having a film thickness of 500 nm. In this process, the outer periphery of the second film substrate was masked so that an adhesive was formed in a region of the second ITO film surface. Further, upon irradiation with UV rays from a UV lamp (irradiance: 7 J/cm$^2$), a high energy pattern corresponding to a comb-like electrode structure was formed on the polyimide film via photo-mask pattern. Subsequently, Ag ink was applied on the high energy pattern by ink-jet printing, and then the Ag ink applied high energy pattern was sintered at 180° C. to thereby obtain a comb-like electrode having a film thickness of 100 nm. In Example 1, the width of the electrode was set as approximately 800 mm, and the respective gaps between the strip-shaped electrodes were set as approximately 5 µm, 10 µm, and 20 µm.

Note that ionmigration occurs between electrodes that have electric potentials, so that in Comparative Example 1, and Examples 1 through 3, comb-like electrodes made from Ag were formed so as to cause electric fields to be generated between the strip-shaped electrodes of the comb-like electrodes. In the transistor, the comb-like electrodes indicate a corresponding one of the source electrode and the drain electrode.

Next, an adhesive (HC-1920/Epoxy resin-based adhesive/ Mitsui Chemicals, Inc.) was applied to an outer periphery of the second film substrate using a dispenser, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the respective first and second inorganic ITO films were thus formed.

An ionmigration test was carried out on the obtained sample. Testing conditions were determined as follows; electric field applied was set as 20V, and a testing environment was set as 85° C./85% RH. As illustrated in FIG. 9, in Example 1, no short circuits due to ionmigration occurred even after 1000 hours in all the conditions where the respective gaps between the strip shaped electrodes were set as 5 µm, 10 µm, and 20 µm. The ion-migration test was finished after 1000 hours. The result shows that the adhesive corresponding to the second adhesive layer 42 formed the respective adhesive interfaces between the adhesive and the respective inorganic first and second inorganic ITO films so as to block moisture intrusion from outside.

Example 2

An $Al_2O_3$ film of 100 nm thickness was deposited on a first film substrate by sputtering. The $Al_2O_3$ film was coated with polyamide acid by spin coating, and the polyamide acid coated $Al_2O_3$ film was then heated at 180° C. to thereby obtain a first polyimide film having a film thickness of 500 nm. Further, upon irradiation with UV rays from a UV lamp (irradiance: 7 J/cm$^2$), a high energy surface (first high energy region) was formed on the first polyimide film.

Likewise, an $Al_2O_3$ film of 100 nm thickness was deposited on a second film substrate by sputtering. The $Al_2O_3$ film was coated with polyamide acid by spin coating, and the polyamide acid coated $Al_2O_3$ film was then heated at 180° C. to thereby obtain a second polyimide film having a film thickness of 500 nm. Further, upon irradiation with UV rays from a UV lamp (irradiance: 7 J/cm$^2$), high energy patterns (second high energy region) corresponding to a comb-like electrode structure and an outer periphery of the second film substrate subject to forming an adhesive were formed on the second polyimide film via photo-mask patterns. Subsequently, Ag ink was applied on the high energy pattern corresponding to the comb-like electrode structure by ink-jet printing, and then the Ag ink applied high energy pattern corresponding to the comb-like electrode structure was sintered at 180° C. to thereby obtain a comb-like electrode having a film thickness of 100 nm. In Example 2, the width of the electrode was set as approximately 800 mm, and the respective gaps between the strip-shaped electrodes were set as approximately 5 µm, 10 µm, and 20 µm.

Next, an adhesive (HC-1920/Epoxy resin-based adhesive/ Mitsui Chemicals, Inc.) was applied to an outer periphery of the second film substrate using a dispenser, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the respective first and second high energy regions formed on the first and second polyimide films were thus formed.

An ionmigration test was carried out on the obtained sample. Testing conditions were determined as follows; electric field applied was set as 20 V, and a testing environment was set as 85° C./85% RH. As illustrated in FIG. 9, in Example 2, a short circuit due to ionmigration occurred after 835 hours in the conditions where the gap between the electrodes was set as 5 µm, whereas no short circuits due to ionmigration occurred after 1000 hours in the conditions where the respective gaps between the electrodes were set as 10 µm and 20 µm. The ionmigration test was finished after 1000 hours. The result shows that the adhesive corresponding to the second adhesive layer 42 formed the respective adhesive interfaces between the adhesive and the respective first and second high energy regions formed on the respective first and second polyimide films so as to block moisture intrusion from outside.

Example 3

An $Al_2O_3$ film of 100 nm thickness was deposited on a first film substrate by sputtering. An indium-tin-oxide (ITO) film of 100 nm was subsequently deposited on an outer periphery region of the first film substrate by sputtering.

Likewise, an $Al_2O_3$ film of 100 nm thickness was deposited on a second film substrate by sputtering. The $Al_2O_3$ film was coated with polyamide acid by spin coating, and the polyamide acid coated $Al_2O_3$ film was then heated at 180° C. to thereby obtain a polyimide film having a film thickness of 500 nm. Further, upon irradiation with UV rays from a UV lamp (irradiance: 7 J/cm$^2$), high energy patterns (high energy region) corresponding to a comb-like electrode structure and an outer periphery of the second film substrate subject to forming an adhesive were formed on the polyimide film via photo-mask patterns. Subsequently, Ag ink was applied on the high energy pattern corresponding to the comb-like electrode structure by ink-jet printing, and then the Ag ink applied high energy pattern corresponding to the comb-like electrode structure was sintered at 180° C. to thereby obtain a comb-like electrode having a film thickness of 100 nm. In Example 3, the width of the electrode was set as approximately 800 mm, and the respective gaps between the strip-shaped electrodes were set as approximately 5 µm, 10 µm, and 20 µm.

Next, an adhesive (HC-1920/Epoxy resin-based adhesive/ Mitsui Chemicals, Inc.) was applied to an outer periphery of the second film substrate using a dispenser, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the inorganic ITO film formed on the first film substrate, and the adhesive and the high energy region formed on the polyimide film were thus formed.

An ionmigration test was carried out on the obtained sample. Testing conditions were determined as follows; electric field applied was set as 20 V, and a testing environment was set as 85° C./85% RH. As illustrated in FIG. 9, in Example 3, no short circuits due to ionmigration occurred even after 1000 hours in all the conditions where the respective gaps between the strip shaped electrodes were set as 5 μm, 10 μm, and 20 μm. The ionmigration test was finished after 1000 hours. The result shows that the adhesive corresponding to the second adhesive layer 42 formed the adhesive interfaces between the adhesive and the inorganic ITO film formed on the first film substrate, and the adhesive and the high energy region formed on the polyimide film so as to block moisture intrusion from outside.

Comparative Example 2

An $Al_2O_3$ film of 100 nm thickness was deposited on a first film substrate by sputtering. The $Al_2O_3$ film was coated with polyamide acid by spin coating, and the polyamide acid coated $Al_2O_3$ film was then heated at 180° C. to thereby obtain a polyimide film having a film thickness of 500 nm.

Likewise, an $Al_2O_3$ film of 100 nm thickness was deposited on a second film substrate by sputtering. The $Al_2O_3$ film was coated with polyamide acid by spin coating, and the polyamide acid coated $Al_2O_3$ film was then heated at 180° C. to thereby obtain an insulating film having a film thickness of 200 nm. Further, upon irradiation with UV rays from a UV lamp (irradiance: 7 J/cm$^2$), a high energy pattern corresponding to a gate electrode structure was formed on the insulating film via photo-mask pattern. Subsequently, Ag ink having Ag dispersed particles therein was applied on the high energy pattern by ink-jet printing, and then the Ag ink applied high energy pattern was sintered at 180° C. to thereby obtain a gate electrode having a film thickness of 100 nm.

The obtained film having the gate electrode was coated with polyamide acid by spin coating, and the polyamide acid coated film having the gate electrode was then heated at 180° C. to thereby obtain a gate insulating film having a film thickness of 500 nm. Further, upon irradiation with UV rays from a UV lamp (irradiance: 7 J/cm$^2$), high energy patterns corresponding to a source electrode and a drain electrode structures were formed on the gate insulating film via respective photo-mask patterns.

Subsequently, Ag ink was applied on the high energy patterns by ink-jet printing, and then the Ag ink applied high energy patterns were sintered at 180° C. to thereby obtain a source electrode and a drain electrode each having a film thickness of 100 nm. In this state, a channel width obtained was 140 μm, and a channel length obtained was 10 μm. Thereafter, an organic semiconductor ink obtained by dissolving the compound represented by the above formula 1 into mesitylene was applied on the high energy patterns by ink-jet printing to form a patterned organic semiconductor, thereby obtaining an organic transistor array.

Next, an adhesive (HC-1920/Epoxy resin-based adhesive/ Mitsui Chemicals, Inc.) was applied to an outer periphery of the second film substrate using a dispenser, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the polyimide films were thus formed.

An environmental test was carried out on transistor properties the obtained sample. Testing conditions were determined as follows; an electric field was not applied, and a testing environment was set as 85° C./85% RH. FIG. 10 is a table illustrating second results of Comparative Example 2 and Example 4. As illustrated in FIG. 10, in Comparative Example 2, there was a significant threshold voltage shift observed after 100 hours. Therefore, on-current degradation may be due to the threshold voltage shift; however, it may have also largely been affected by Ag ionmigration.

Example 4

An $Al_2O_3$ film of 100 nm thickness was deposited on a first film substrate by sputtering. An indium-tin-oxide (ITO) film of 100 nm was subsequently deposited on an outer periphery region of the first film substrate by sputtering.

Likewise, an $Al_2O_3$ film of 100 nm thickness was deposited on a second film substrate by sputtering. The $Al_2O_3$ film was coated with polyamide acid by spin coating, and the polyamide acid coated $Al_2O_3$ film was then heated at 180° C. to thereby obtain an insulating film having a film thickness of 200 nm. Further, upon irradiation with UV rays from a UV lamp (irradiance: 7 J/cm$^2$), a high energy pattern corresponding to a gate electrode structure was formed on the insulating film via photo-mask pattern. Subsequently, Ag ink having Ag dispersed particles therein was applied on the high energy pattern by ink-jet printing, and then the Ag ink applied high energy pattern was sintered at 180° C. to thereby obtain a gate electrode having a film thickness of 100 nm.

The obtained film having the gate electrode was coated with polyamide acid by spin coating, and the polyamide acid coated film having the gate electrode was then heated at 180° C. to thereby obtain a gate insulating film having a film thickness of 500 nm. Further, upon irradiation with UV rays from a UV lamp(irradiance: 7 J/cm$^2$), high energy patterns corresponding to a source electrode and drain electrode structures and an outer periphery of the second film substrate subject to forming an adhesive were formed on the gate insulating film via photo-mask patterns.

Subsequently, Ag ink was applied on the high energy patterns corresponding to the source electrode and drain electrode structures by ink-jet printing, and then the Ag ink applied high energy patterns were sintered at 180° C. to thereby obtain a source electrode and a drain electrode each having a film thickness of 100 nm. In this state, a channel width obtained was 140 μm, and a channel length obtained was 10 μm. Thereafter, an organic semiconductor ink obtained by dissolving the compound represented by the above formula 1 into mesitylene was applied on the high energy patterns corresponding to the source electrode and drain electrode structures by ink-jet printing to form a patterned organic semiconductor layer, thereby obtaining an organic transistor array.

Next, an adhesive (HC-1920/Epoxy resin-based adhesive/ Mitsui Chemicals, Inc.) was applied to the outer periphery of the second film substrate using a dispenser, and the adhesive applied second film substrate was then prebaked at 90° C. for 10 minutes. The first film substrate was then placed on the second film substrate. The first and second film substrates having the adhesive placed therebetween were then cured by heating at 120° C. for 90 minutes while applying a force. After having bonded the first and second film substrates with the adhesive placed therebetween, an adhesive width obtained was approximately 5 mm, and adhesive interfaces between the adhesive and the inorganic ITO film formed on the first film substrate, and the adhesive and the high energy region formed on the polyimide film (insulating film) were thus formed.

An environmental test was carried out on transistor properties the obtained sample. Testing conditions were determined as follows; an electric field was not applied, and a testing environment was set as 85° C./85% RH. As illustrated in FIG. 10, in Comparative Example 2, there was a significant threshold voltage shift observed after 100 hours. However, the threshold voltage shift obtained in Example 4 was smaller than that obtained in Comparative Example 2. Therefore, on-current degradation in Example 4 may solely be due to the threshold voltage shift and may not have been affected by Ag ionmigration.

The result shows that the adhesive corresponding to the second adhesive layer 42 formed the adhesive interfaces between the adhesive and the inorganic ITO film formed on the first film substrate, and the adhesive and the high energy region were formed on the polyimide film so as to suppress moisture intrusion from outside.

Example 5

An $Al_2O_3$ film of 100 nm thickness was deposited on a first film substrate by sputtering. An indium-tin-oxide (ITO) film of 100 nm was subsequently deposited over an entire surface of the first film substrate by sputtering. Meanwhile, 20 parts by weight of titanium oxide, 1 part by weight of acid polymer, 2 parts by weight of silicone polymer graft carbon black (MX3-GRX-001/NIPPON SHOKUBAI CO., LTD), and 77 parts by weight of silicone oil (KF96L-1 cs/SHIN-ETSU CHEMICAL Co., LTD) were mixed, and the obtained mixture was dispersed by ultrasonic waves for 1 hour, to thereby prepare a black-and-white particle containing fluid dispersion. The prepared black-and-white particle containing fluid dispersion was formed into microcapsules by gelatin-gum arabic complex coacervation method. The average particle size of the microcapsules was approximately 60 μm.

Next, a fluid dispersion containing the microcapsules was prepared by dispersing the microcapsules in a urethane resin. A wire blade method was used to expand the fluid dispersion having the microcapsules dispersed in the urethane resin solution on the first film substrate to thereby fabricate a microcapsule substrate including an image display layer having memory properties. In this expanding process, an outer periphery of the first film substrate where a second adhesive layer was formed was masked so that the outer periphery having the ITO film surface was exposed.

Similar to the first film substrate, an Al2O3 film of 100 nm thickness was deposited on a second film substrate by sputtering. The Al2O3 film was coated with polyamide acid by spin coating, and the polyamide acid coated $Al_2O_3$ film was then heated at 180° C. to thereby obtain an insulating film having a film thickness of 200 nm. Further, upon irradiation with UV rays from a UV lamp (irradiance: 7 J/cm$^2$), high energy patterns corresponding to a scan line structure and a gate electrode structure were formed on the insulating film via photo-mask patterns. Subsequently, Ag ink having Ag dispersed particles was applied on the high energy patterns corresponding to the scan line structure and the gate electrode structure by ink-jet printing, and then the Ag ink applied high energy patterns were sintered at 180° C. to thereby obtain scan lines and a gate electrode having a film thickness of 100 nm.

The obtained film having the scan lines and gate electrode was coated with polyamide acid by spin coating, and the polyamide acid coated film having the scan lines and the gate electrode was then heated at 180° C. to thereby obtain a gate insulating film having a film thickness of 500 nm. Further, upon irradiation with UV rays from a UV lamp (irradiance: 7 J/cm$^2$), high energy patterns corresponding to a signal line structure and a source electrode structure, and high energy patterns corresponding to a drain electrode structure and a second adhesive layer forming region were formed on the insulating film via photo-mask patterns. Subsequently, Ag ink was applied on the high energy patterns corresponding to the signal line structure and the source electrode structure, and high energy patterns corresponding to the drain electrode structure and the second adhesive layer forming region by ink-jet printing, and then the Ag ink applied high energy patterns were sintered at 180° C. to thereby obtain a source electrode and a drain electrode each having a film thickness of 100 nm. In this state, a channel width obtained was 140 μm, and a channel length obtained was 10 μm.

Thereafter, an organic semiconductor ink obtained by dissolving the compound represented by the above formula 1 into mesitylene was applied on the high energy patterns corresponding to the signal line structure and the source electrode structure, and high energy patterns corresponding to the drain electrode structure and the second adhesive layer forming region by ink-jet printing to forma patterned organic semiconductor layer. Next, an insulating paste containing polyvinyl butyral resin, silica filler, and ethylene glycol hexyl ether was printed by screen printing, and then the printed insulating paste was dried under reduced pressure, to thereby form an interlayer insulating film having a through hole above the drain electrode. Further, a thermosetting paste containing silver was printed by screen printing, and the printed thermosetting paste containing silver was dried to form a conductive layer connected to the drain electrode via the through hole. An organic thin film transistor array substrate was thus obtained.

Next, a first adhesive layer (NeoRezR-9330/urethane resin-based adhesive/DSM) was applied over a region on the first film substrate where microcapsules were formed using a dispenser, whereas a second adhesive (HC-1920/Epoxy resin-based adhesive/Mitsui Chemicals, Inc.) was applied to the ITO surface of the outer periphery of the second film substrate using a dispenser, and the adhesive applied second film substrate was then prebaked at 90° C. for 10 minutes. The first film substrate was then placed on the second film substrate. The first and second film substrates having the first and second adhesives placed therebetween were then cured by heating at 120° C. for 90 minutes while applying a force. After having bonded the first and second film substrates with the first and second adhesives placed therebetween, an adhesive width obtained was approximately 5 mm, and adhesive interfaces between the adhesive and the inorganic ITO film were formed on the first substrate, and the adhesive and the high energy region formed on the polyimide film were thus formed. As a result, an electrophoretic image display panel illustrated in FIG. 5 was thus obtained.

Figure 11:
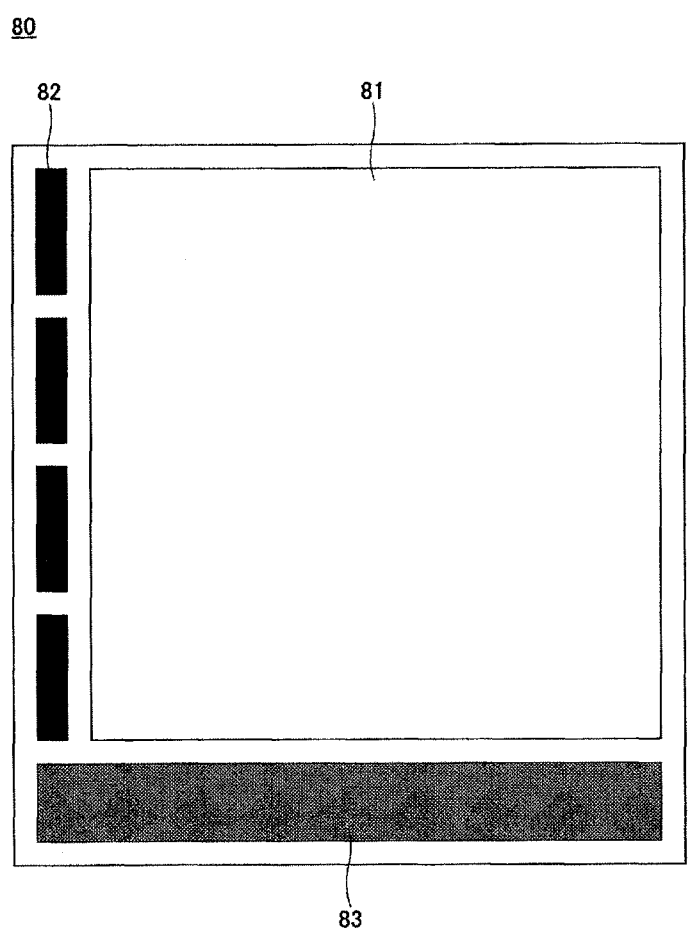
FIG. 11 is a view illustrating an example of an electrophoretic image display apparatus according to the embodiment of the invention.

Further, the thus obtained electrophoretic image display panel may be combined with other electronic devices so as to obtain an image forming apparatus 80 including a display unit 81 and a drive control IC 82, and an operations unit 93 illustrated in FIG. 11.

The preferred embodiments and examples are described above. However, the present invention is not limited to these embodiments and examples, and various modifications and substitutions may be made to the above embodiments and examples without departing from the scope of the present invention.

For example, in the embodiments described above, the present invention is applied to a bottom gate type organic thin film transistor array having the gate electrode, the gate insulator layer, and the source and drain electrodes successively stacked on the substrate. However, the present invention may of course be applicable to a top gate type organic thin film transistor array in which the source and drain electrodes, the gate insulator layer, and the gate electrode are successively stacked on the substrate.

In addition, a liquid-crystal type image display medium such as polymer-dispersed liquid-crystal, an organic EL type image display medium, and the like may also be used as image display media other than the electrophoretic image display medium.

According to the disclosed technologies described above, it is possible to fabricate the image display panel having the organic semiconductor and the image display apparatus having the image display panel capable of improving migration resistance and suppressing deterioration of the organic semiconductor layer without increasing the fabrication cost.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification related to a showing of the superiority or inferiority of the invention. Although the embodiments have been described in detail, it should be understood that various changes, substitutions, and alterations could be made hereto without departing from the spirit and scope of the invention.

The present application is based on Japanese Priority Application No. 2009-112007 filed on May 1, 2009 and Japanese Priority Application No. 2010-037642 filed on Feb. 23, 2010, with the Japanese Patent Office, the entire contents of which are hereby incorporated by reference.

What is claimed is:

1. An image display panel comprising:
a gate electrode formed on a first substrate;
a gate insulating film formed over the gate electrode;
a source electrode, a drain electrode, and a first adhesive, formed at intervals on the gate insulating film;
an organic semiconductor layer formed in regions on the source electrode and the drain electrode including a space formed therebetween;
an interlayer insulating film formed to cover the gate insulating film, the source electrode, the organic semiconductor layer, and part of the drain electrode;
a conductive layer formed on the interlayer insulating film so as to be connected to the drain electrode via a through hole;
a second adhesive having a predetermined volume resistance and formed over the interlayer insulating film and the conductive layer;
an image display medium having an electrophoretic region formed on the second adhesive;
an inorganic film formed on the image display medium and on the first adhesive formed on the gate insulating film; and
a second substrate placed on the inorganic film,
wherein the second adhesive having the predetermined volume resistance is formed in the electrophoretic region of the image display medium, and the first adhesive is formed around the second adhesive.

2. An image display panel comprising:
a gate electrode formed on a first substrate;
a gate insulating film formed over the gate electrode;
a source electrode and a drain electrode formed at intervals on the gate insulating film formed over the gate electrode;
an organic semiconductor layer formed in regions on the source electrode and the drain electrode including a space formed therebetween;
an interlayer insulating film formed to cover the gate insulating film, the source electrode, the organic semiconductor layer, and part of the drain electrode;
a conductive layer and a first adhesive formed on the interlayer insulating film, such that the conductive layer is connected to the drain electrode via a through hole;
a second adhesive having a predetermined volume resistance and formed over the interlayer insulating film and the conductive layer;
an image display medium formed on the second adhesive;
an inorganic film formed on the image display medium and on the first adhesive; and
a second substrate placed on the inorganic film,
wherein the second adhesive having the predetermined volume resistance is formed in the electrophoretic region of the image display medium, and the first adhesive is formed around the second adhesive.

3. An image display panel comprising:
a first inorganic film formed over a first substrate;
a gate electrode and a first adhesive formed on the first inorganic film formed over the first substrate;
a gate insulating film formed over the gate electrode;
a source electrode and a drain electrode formed at intervals on the gate insulating film;
an organic semiconductor layer formed in regions on the source electrode and the drain electrode including a space formed therebetween;
an interlayer insulating film formed to cover the gate insulating film, the source electrode, the organic semiconductor layer, and part of the drain electrode;
a conductive layer formed on the interlayer insulating film so as to be connected to the drain electrode via a through hole;
a second adhesive having a predetermined volume resistance and formed over the interlayer insulating film and the conductive layer;
an image display medium formed on the second adhesive;
a second inorganic film formed on the image display medium and on the first adhesive formed on the first inorganic film on the first substrate; and
a second substrate placed on the second inorganic film formed on the image display medium,
wherein the second adhesive having the predetermined volume resistance is formed in the electrophoretic region of the image display medium, and the first adhesive is formed around the second adhesive.

4. The image display panel as claimed in claim 1, wherein the second adhesive includes conductive filler.

5. The image display panel as claimed in claim 1, wherein one or both of the first and the second substrates include a film substrate having flexibility.

6. The image display panel as claimed in claim 1, wherein materials for the gate electrode, the source electrode, and the drain electrode include metallic ink including dispersed metallic particles.

7. The image display panel as claimed in claim 1, wherein the organic semiconductor layer is formed of a polymer material having a triarylamine skeleton.

8. The image display panel as claimed in claim 1, wherein the organic semiconductor layer is formed by ink-jet printing.

9. The image display panel as claimed in claim 1, wherein surface energy of the gate insulating film and the interlayer insulating film is increased by irradiating the gate insulating film and the interlayer insulating film with ultraviolet rays.

10. The image display panel as claimed in claim 1, wherein the image display medium is an electrophoretic type display medium.

11. The image display panel as claimed in claim 10, wherein the electrophoretic type display medium includes a transparent conductive film, and the inorganic film is the transparent conductive film.

12. The image display panel as claimed in claim 1, further comprising a transistor array including the gate electrode, the source electrode, the drain electrode, and the organic semiconductor layer, wherein the transistor array and the image display medium include flexibility.

13. An image forming apparatus comprising: the image display panel as claimed in claim 1, a display unit, a control unit, and an operations unit.

* * * * *